(12) United States Patent
Kitada (10) Patent No.: US 9,312,791 B2
(45) Date of Patent: Apr. 12, 2016

(54) PIEZOELECTRIC ELEMENT, LIQUID EJECTING HEAD, LIQUID EJECTING APPARATUS, ULTRASONIC SENSOR, PIEZOELECTRIC MOTOR, AND POWER GENERATING APPARATUS

(71) Applicant: Seiko Epson Corporation, Tokyo (JP)

(72) Inventor: Kazuya Kitada, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/541,828

(22) Filed: Nov. 14, 2014

(65) Prior Publication Data
US 2015/0138281 A1  May 21, 2015

(30) Foreign Application Priority Data
Nov. 18, 2013 (JP) ................. 2013-238246

(51) Int. Cl.
| | | |
|---|---|---|
| B41J 2/045 | (2006.01) |
| H02N 2/18 | (2006.01) |
| B41J 2/14 | (2006.01) |
| H01L 41/113 | (2006.01) |
| H02N 2/00 | (2006.01) |
| G11C 11/22 | (2006.01) |
| H01L 37/02 | (2006.01) |
| H01L 41/09 | (2006.01) |
| H01L 41/187 | (2006.01) |
| C04B 35/26 | (2006.01) |

(52) U.S. Cl.
CPC .......... *H02N 2/186* (2013.01); *B41J 2/14201* (2013.01); *B41J 2/14233* (2013.01); *C04B 35/26* (2013.01); *G11C 11/22* (2013.01); *H01L 37/025* (2013.01); *H01L 41/098* (2013.01); *H01L 41/1132* (2013.01); *H01L 41/1878* (2013.01); *H02N 2/001* (2013.01); *B41J 2202/03* (2013.01); *C04B 2235/3213* (2013.01); *C04B 2235/3215* (2013.01); *C04B 2235/3232* (2013.01); *C04B 2235/3262* (2013.01); *C04B 2235/3298* (2013.01); *C04B 2235/441* (2013.01)

(58) Field of Classification Search
None
See application file for complete search history.

(56) References Cited

U.S. PATENT DOCUMENTS

| | | | | |
|---|---|---|---|---|
| 2006/0255686 A1* | 11/2006 | Saito | ............................ | 310/322 |
| 2007/0108870 A1* | 5/2007 | Atsuta | .......................... | 310/317 |
| 2011/0007115 A1 | 1/2011 | Kobayashi et al. | | |
| 2011/0074249 A1* | 3/2011 | Sakashita et al. | ............. | 310/339 |
| 2011/0292134 A1* | 12/2011 | Sasaki et al. | .................... | 347/68 |
| 2012/0147100 A1* | 6/2012 | Nawano et al. | ................. | 347/71 |

FOREIGN PATENT DOCUMENTS

| | | |
|---|---|---|
| JP | 2001-223404 A | 8/2001 |
| JP | 2009252789 A | 10/2009 |
| JP | 2011-001257 A | 1/2011 |
| JP | 2011-035385 A | 2/2011 |

* cited by examiner

*Primary Examiner* — Erica Lin
(74) *Attorney, Agent, or Firm* — Harness, Dickey & Pierce, P.L.C.

(57) ABSTRACT

A piezoelectric element includes: a first electrode; a piezoelectric body layer which is provided on the first electrode; and a second electrode which is provided on the piezoelectric body layer, the piezoelectric body layer is made of a composite oxide with a perovskite structure, which contains bismuth, barium, iron, titanium, and strontium, and the content of strontium with respect to barium is equal to or greater than 5 mol % and equal to or less than 18 mol %.

6 Claims, 10 Drawing Sheets

EXAMPLE 3

FIG. 9B

COMPARATIVE EXAMPLE 1

PIEZOELECTRIC ELEMENT, LIQUID EJECTING HEAD, LIQUID EJECTING APPARATUS, ULTRASONIC SENSOR, PIEZOELECTRIC MOTOR, AND POWER GENERATING APPARATUS

BACKGROUND

1. Technical Field

The present invention relates to a piezoelectric element, a liquid ejecting head, a liquid ejecting apparatus, an ultrasonic sensor, a piezoelectric motor, and a power generating apparatus which are stably driven.

2. Related Art

There is a piezoelectric element which is configured by interposing a piezoelectric material with an electromechanical conversion function, for example, a piezoelectric body layer, which is made of a crystallized piezoelectric material, between two electrodes. Such a piezoelectric element is mounted as an actuator device in a flexural vibrating mode, for example, on a liquid ejecting head. Representative examples of the liquid ejecting head include an ink jet recording head in which a part of the pressure generation chambers communicating with nozzle openings for ejecting ink droplets is configured of a vibrating plate and ink in the pressure generation chambers is pressurized by causing the piezoelectric element to deform the vibrating plate and is ejected as ink droplets from the nozzle openings.

The piezoelectric material used in the piezoelectric body layer which configures such a piezoelectric element is required to have a high piezoelectric property. Although representative examples thereof include lead zirconate titanate (PZT) (see JP-A-2001-223404, for example), a piezoelectric element in which content of lead is suppressed has been required from a viewpoint of environmental safety. Examples of a piezoelectric material which does not contain lead include a lead-free piezoelectric material made of a $BaTiO_3$-based oxidative product or a $BiFeO_3$-based oxidative product with a perovskite structure (see JP-A-2009-252789, for example).

However, a lead-free piezoelectric material proposed hitherto has a lower piezoelectric property than that of a lead (Pb)-based material, and a displacement amount which is more satisfactory than that of the lead (Pb)-based material has not yet been obtained in the current situation. In order to enhance the displacement amount of such a lead-free piezoelectric material, a technique of substituting a part of elements occupying an A site of the perovskite structure or a part of elements occupying a B site thereof with an element having a different ion valence and a different ion radius has been proposed (see JP-A-2011-035385 and JP-A-2011-001257, for example).

However, it is necessary to select a site of substitution and an element of substitution in the perovskite structure, to further examine the amount of substitution and the like, and to further achieve optimization in order to achieve the displacement amount which is more satisfactory than that of the lead (Pb)-based material.

It is a matter of course that not only an ink jet recording head but also other liquid ejecting heads ejecting liquid droplets other than ink have such a problem. Moreover, piezoelectric elements used in an ultrasonic sensor, a piezoelectric motor, and a power generating apparatus also have the same problem.

SUMMARY

An advantage of some aspects of the invention is to provide a piezoelectric element which is configured of a $BaTiO_3$-based piezoelectric material and a $BiFeO_3$-based piezoelectric material containing strontium having an enhanced displacement amount, a liquid ejecting head, a liquid ejecting apparatus, an ultrasonic sensor, a piezoelectric motor, and a power generating apparatus, each of which is provided with the piezoelectric element.

According to a first aspect of the invention, there is provided a piezoelectric element including: a first electrode; a piezoelectric body layer which is provided on the first electrode; and a second electrode which is provided on the piezoelectric body layer, in which the piezoelectric body layer is made of a composite oxide with a perovskite structure, which contains bismuth, barium, iron, titanium, and strontium, and in which the content of strontium with respect to barium is equal to or greater than 5 mol % and equal to or less than 18 mol %. According to the aspect, it is possible to obtain a piezoelectric element which has an enhanced displacement amount by configuring the piezoelectric body layer with the $BaTiO_3$-based piezoelectric material and the $BiFeO_3$-based piezoelectric material containing strontium. In addition, since the piezoelectric body layer is configured of a lead-free piezoelectric material, it is possible to reduce environmental burden. Furthermore, since the piezoelectric body layer does not contain sodium and potassium which are especially sensitive to moisture, it is possible to obtain a piezoelectric element, an aging variation of which due to moisture absorption is relatively small, as a lead-free material.

According to a second aspect of the invention, there is provided a liquid ejecting head including: the piezoelectric element according to the first aspect. According to the aspect, it is possible to obtain a liquid ejecting head with an excellent ejection property since the liquid ejecting head is provided with the piezoelectric element which has the enhanced displacement amount. In addition, since the piezoelectric body layer is configured of the lead-free piezoelectric material, it is possible to provide a liquid ejecting head capable of reducing environmental burden.

According to a third aspect of the invention, there is provided a liquid ejecting apparatus including: the liquid ejecting head according to the second aspect; a transport part which transports a recording medium; and liquid which is ejected from the liquid ejecting head. According to the aspect, it is possible to obtain a reliable liquid ejecting apparatus with an excellent ejection property since the liquid ejecting apparatus is provided with the liquid ejecting head with the excellent ejecting property. In addition, since the piezoelectric body layer is configured of the lead-free piezoelectric material, it is possible to provide a liquid ejecting apparatus capable of reducing environmental burden.

According to a fourth aspect of the invention, there is provided an ultrasonic sensor including: the piezoelectric element according to the first aspect; a vibrating part which transmits displacement caused by driving the piezoelectric element to the outside; and a matching layer which transmits a generated pressure wave to the outside. According to the aspect, it is possible to obtain an ultrasonic sensor with high detection sensitivity since the ultrasonic sensor is provided with the piezoelectric element which has the enhanced displacement amount. In addition, since the piezoelectric body layer is configured of the lead-free piezoelectric material, it is possible to provide an ultrasonic sensor capable of reducing environmental burden.

According to a fifth aspect of the invention, there is provided a piezoelectric motor including at least: the piezoelectric element according to the first aspect; a vibrating body in which the piezoelectric element is disposed; and a moving body which is brought into contact with the vibrating body.

According to the aspect, it is possible to obtain a piezoelectric motor with high driving efficiency since the piezoelectric motor is provided with the piezoelectric element which has the enhanced displacement amount. In addition, since the piezoelectric body layer is configured of the lead-free piezoelectric material, it is possible to provide a piezoelectric motor capable of reducing environmental burden.

According to a sixth aspect of the invention, there is provided a power generating apparatus including: the piezoelectric element according to the first aspect; and an extraction electrode which extracts an electric charge caused by the piezoelectric element from at least one of the first electrode and the second electrode. According to the aspect, it is possible to obtain a power generating apparatus with high power generating efficiency since the power generating apparatus is provided with the piezoelectric element which has the enhanced displacement amount. In addition, since the piezoelectric body layer is configured of the lead-free piezoelectric material, it is possible to provide a power generating apparatus capable of reducing environmental burden.

BRIEF DESCRIPTION OF THE DRAWINGS

The invention will be described with reference to the accompanying drawings, wherein like numbers reference like elements.

DESCRIPTION OF EXEMPLARY EMBODIMENTS

Liquid Ejecting Head

Figure 1:
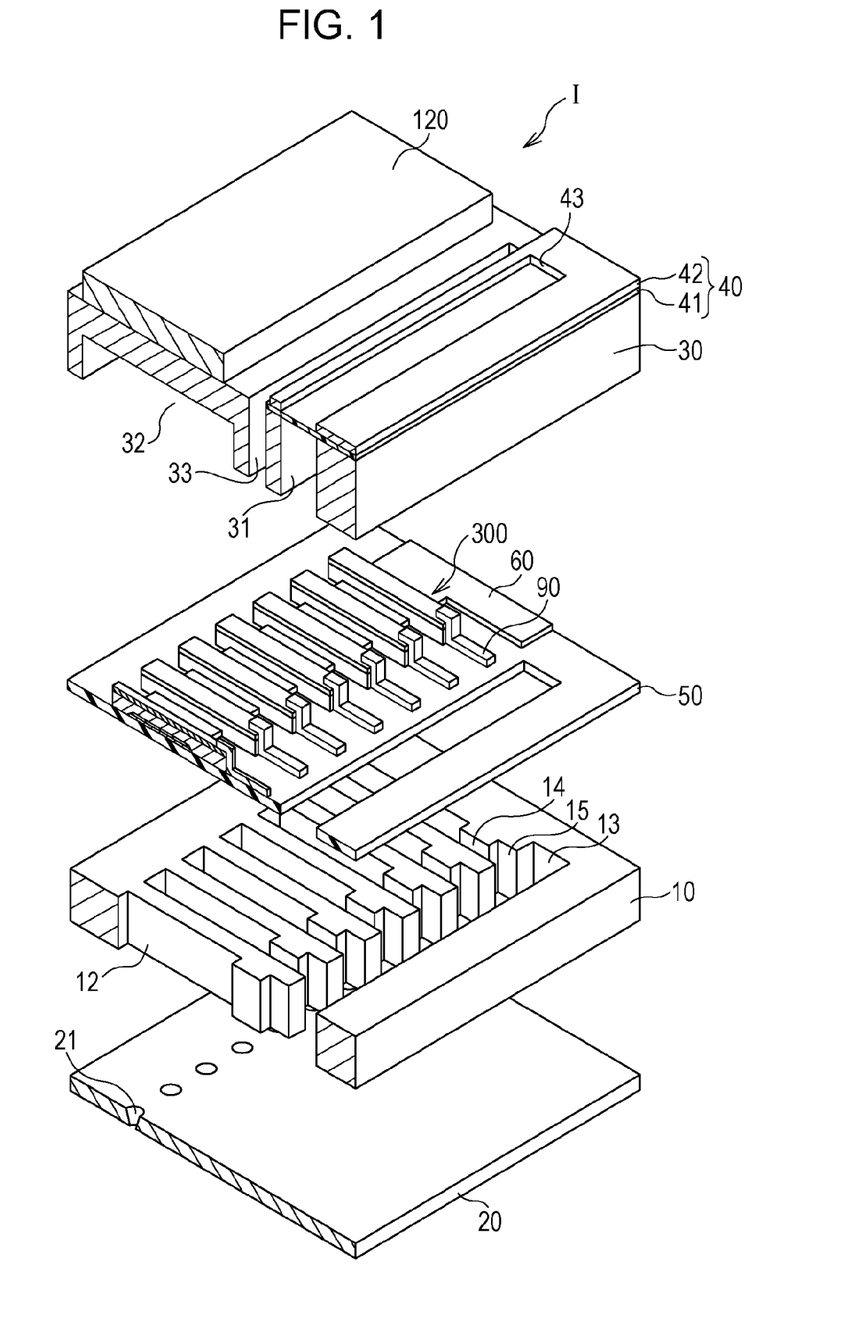
FIG. 1 is an exploded perspective view showing an outline configuration of a recording head according to a first embodiment.
Figure 2:
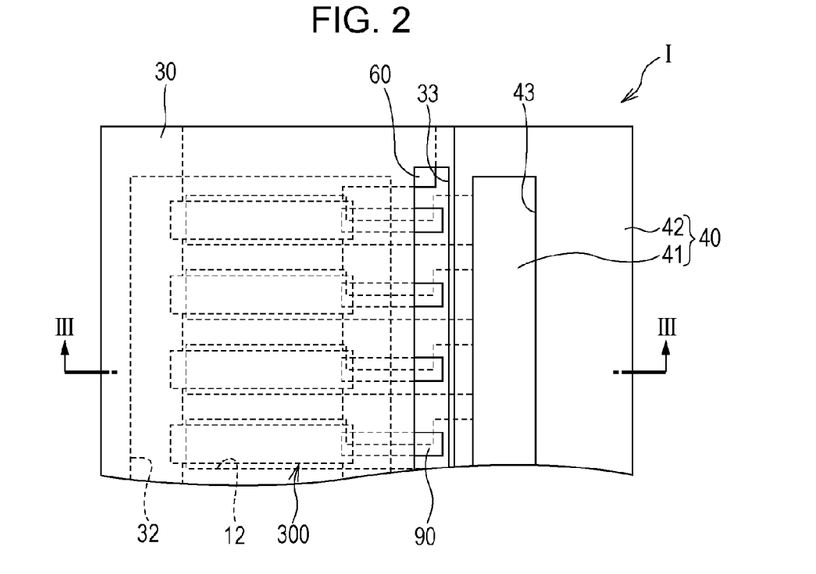
FIG. 2 is a planar view of the recording head according to the first embodiment.
Figure 3:
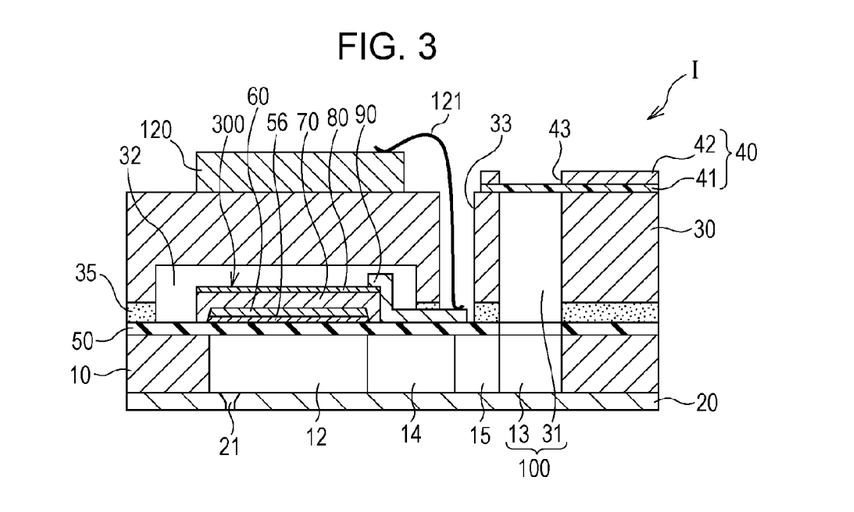
FIG. 3 is a cross-sectional view of the recording head according to the first embodiment.

FIG. 1 is an exploded perspective view showing an outline configuration of an ink jet recording head as an example of a liquid ejecting head which is provided with a piezoelectric element according to a first embodiment of the invention. FIG. 2 is a planar view of FIG. 1, and FIG. 3 is a cross-sectional view taken along line III-III in FIG. 2. As shown in FIGS. 1 to 3, a flow path formation substrate 10 according to the embodiment is made of a silicon single crystal substrate, and an elastic film 50 made of silicon dioxide is formed on one surface thereof.

A plurality of pressure generation chambers 12 are aligned in the flow path formation substrate 10 in the width direction thereof. In addition, a communication part 13 is formed in a region outside the pressure generation chambers 12 in the longitudinal direction in the flow path formation substrate 10, and the communication part 13 communicates with the respective pressure generation chambers 12 via ink supply paths 14 and communication paths 15 which are provided for each of the pressure generation chambers 12. The communication part 13 communicates with a manifold part 31 of a protection substrate, which will be described later, and configures a part of a manifold which functions as a common ink chamber for the respective pressure generation chambers 12. Each of the ink supply paths 14 is formed to have a narrower width than that of each pressure generation chamber 12 and constantly maintains flow path resistance of the ink which flows from the communication part 13 into the pressure generation chamber 12. Although each ink supply path 14 is formed by narrowing the width of the flow path on one side in this embodiment, the ink supply path may be formed by narrowing the width of the flow path on both sides. In addition, the ink supply path may be formed by narrowing the flow path in the thickness direction instead of narrowing the width of the flow path. According to the embodiment, the flow path formation substrate 10 is provided with a liquid flow path configured of the pressure generation chambers 12, the communication part 13, the ink supply paths 14, and the communication paths 15.

In addition, a nozzle plate 20 in which nozzle openings 21 communicating with the vicinity of ends of the respective pressure generation chambers 12 on the side opposite to the ink supply paths 14 are bored is fixedly attached to the flow path formation substrate 10 on a side of an opening surface with an adhesive agent, a thermal welding film, or the like. In addition, the nozzle plate 20 is made of glass ceramics, a silicon single crystal substrate, or stainless steel, for example.

In contrast, the elastic film 50 is formed on such a flow path formation substrate 10 on the side opposite to the opening surface as described above, and an adhesion layer 56 with a thickness from about 30 nm to about 50 nm, for example, which is made of titanium oxide or the like is formed on the elastic film 50. The adhesion layer 56 is provided in order to enhance an adhesion property between the elastic film 50 and a first electrode 60. In addition, an insulator film made of zirconium oxide or the like may be provided on the elastic film 50 as necessary.

Furthermore, on the adhesion layer 56, the first electrode 60, a piezoelectric body layer 70 which is a thin film with a thickness of equal to or less than 3 µm, preferably with a thickness from 0.3 µm to 1.5 µm, and a second electrode 80 are laminated to configure a piezoelectric element 300. Here, the piezoelectric element 300 represents a part including the first electrode 60, the piezoelectric body layer 70, and the second electrode 80. In general, one of electrodes in the piezoelectric element 300 is made to function as a common electrode, and the other electrode and the piezoelectric body layer 70 are patterned and configured for each of the pressure generation chambers 12. According to the embodiment, the first electrode 60 is made to function as a common electrode of the piezoelectric element 300, and the second electrode 80 is made to function as individual electrodes of the piezoelectric element 300. However, the opposite configuration may be employed for convenience in a drive circuit or wiring. Here, the piezoelectric element 300 and a vibrating plate which is displaced by being driven by the piezoelectric element 300 will be collectively referred to as an actuator device. Although the elastic film 50, the adhesion layer 56, the first electrode 60, and the insulator film which is provided as necessary act as the vibrating plate in the above example, it is a matter of course that the invention is not limited thereto, and the elastic film 50 and the adhesion layer 56 may not be provided, for example. In addition, the piezoelectric element 300 may also serve as a vibrating plate. However, in a case of providing the first electrode 60 directly on the flow path formation substrate 10, it is preferable to protect the first electrode 60 with an insulating protection film or the like so as not to establish electric continuity between the first electrode 60 and the ink.

According to the embodiment, the piezoelectric body layer 70 is made of composite oxide with the perovskite structure, which contains bismuth (Bi), barium (Ba), iron (Fe), titanium (Ti), and strontium (Sr). Twelve oxygen atoms are coordinated in an A site of the perovskite structure, namely the $ABO_3$-type structure, and six oxygen atoms are coordinated in a B site thereof to configure an octahedron. In the embodiment, Bi, Ba, and Sr are located in the A site, and Fe and Ti are located in the B site.

In the piezoelectric body layer 70, a composite oxide with the perovskite structure, which contains Bi, Ba, Fe, and Ti, contains a predetermined amount of Sr, and it is believed that Sr is present mainly in a state where a part of Ba in the A site is substituted. In addition, Sr may be present in a state where a part of Bi in the A site is substituted, and there is also a case where Sr is present at a crystal gain boundary.

According to the invention, the content of Sr with respect to Ba contained in the piezoelectric body layer 70 is equal to or greater than 5 mol % and equal to or less than 18 mol %. By setting the content of Sr with respect to Ba to be in the range of equal to or greater than 5 mol % and equal to or less than 18 mol %, it is possible to enhance the displacement amount of the piezoelectric element as will be described later in examples. In addition, it is not possible to achieve the effect of enhancing the displacement amount if the content of Sr deviates from the range. Since the piezoelectric body layer 70 according to the invention does not contain sodium and potassium which are especially sensitive to moisture, it is possible to obtain a piezoelectric element, an aging variation of which due to moisture absorption is relatively small, as a lead-free material.

Representative examples of the composite oxide which configures such a piezoelectric body layer 70 include composite oxide with the perovskite structure, which is configured of a mixed crystal of bismuth ferrate ($BiFeO_3$) and barium titanate in which a part of Ba located in the A site is substituted with Sr, that is, barium strontium titanate (($Ba,Sr$)$TiO_3$).

The composition of such a piezoelectric body layer which is made of composite oxide with the perovskite structure containing Bi, Ba, Fe, Ti, and Sr is represented as a mixed crystal represented by the following Formula (1) which is a representative example. In addition, Formula (1) can also be represented by Formula (1'). Here, the descriptions of Formulae (1) and (1') are composition descriptions based on stoichiometry, and not only inevitable variations in composition due to lattice mismatch or partial deficiency of elements (Bi, Fe, Ba, Ti, Sr, and O) but also partial substitution of the elements are allowed as long as the perovskite structure can be achieved as described above. If it is assumed that a stoichiometric ratio is 1, for example, materials within a range from 0.85 to 1.20 are allowed. In addition, there is also a case where materials which have the same ratio between elements in the A site and elements in the B site while being represented by different formulae as will be described below are regarded as the same composite oxide.

Here, Bi contained in the piezoelectric body layer 70 may exceed the stoichiometric composition. Specifically, it is possible to enhance the displacement amount by containing Bi so as to exceed the stoichiometric composition within a range of greater than 0 mol % and equal to or less than 10 mol %.

(1)

(1')

In addition, the composite oxide with the perovskite structure, which contains Bi, Ba, Fe, Ti, and Sr, preferably contains at least one element selected from manganese (Mn), chromium (Cr), cobalt (Co), nickel (Ni), copper (Cu), and zinc (Zn) in addition to Bi, Fe, Ba, Ti, and Sr. By including at least one element selected from Mn, Cr, Co, Ni, Cu, and Zn, it is possible to enhance a leakage property and to realize a liquid ejecting head with an excellent piezoelectric property using the lead-free piezoelectric material. In addition, it is preferable that the composite oxide containing such elements preferably also have the perovskite structure.

In a case where the piezoelectric body layer 70 contains at least one element selected from Mn, Cr, Co, Ni, Cu, and Zn, Mn, Cr, Co, Ni, Cu, and Zn are located in the B site. In a case where the piezoelectric body layer 70 contains Mn, for example, the composite oxide configuring the piezoelectric body layer 70 is represented as composite oxide with a structure, in which a part of Fe is in the form of a solid solution containing uniformly solid-dissolved bismuth ferrate and barium strontium titanate, or with the perovskite structure of a mixed crystal of bismuth manganite ferrate and barium strontium titanate, and it is known that the leakage property is enhanced. In a case of containing Cr, Co, Ni, Cu, or Zn, the leakage property is enhanced in the same manner as in the case of Mn. In an X-ray diffraction pattern, bismuth ferrate, barium strontium titanate, and bismuth manganite ferrate, bismuth chromate ferrate, bismuth cobaltate ferrate, bismuth nickelate ferrate, bismuth cuprate ferrate, and bismuth zincate ferrate, in which a part of Fe in bismuth ferrate is substituted with Mn and the like, are not detected individually. In addition, it is known that the leakage property is enhanced even if two other transition metal elements are contained at the same time, such metal elements can also be used in the piezoelectric body layer 70, and other known additives may be contained in order to enhance the properties thereof.

In addition, the thickness of the piezoelectric body layer 70 is not limited. For example, the thickness of the piezoelectric body layer 70 is equal to or less than 3 μm and preferably ranges from 0.3 μm to 1.5 μm.

For the second electrode 80, any of various kinds of metal such as iridium (Ir), platinum (Pt), tungsten (W), tantalum (Ta), and molybdenum (Mo) may be used, and it is also possible to exemplify alloys thereof and metal oxides thereof such as iridium oxide. A lead electrode 90 which is drawn from the vicinity of an end portion on the side of each ink supply path 14, extends to the elastic film 50 or the insulator film that is provided as necessary, and is made of gold (Au), for example, and connected to the second electrode 80 corresponding to each of the individual electrodes in the piezoelectric element 300. A voltage is selectively applied to each piezoelectric element 300 via the lead electrode 90.

A protection substrate 30 which includes a manifold part 31 configuring at least a part of a manifold 100 is joined above the flow path formation substrate 10 in which such a piezoelectric element 300 is formed, namely above the first electrode 60, the elastic film 50, the insulator film which is provided as necessary, and the lead electrode 90, via an adhesive agent 35. According to the embodiment, the manifold part 31 is formed above in the width direction of the pressure generation chambers 12 so as to penetrate through the protection substrate 30 in the thickness direction and communicates with the communication part 13 in the flow path formation substrate 10 as described above to configure the manifold 100 which functions as a common ink chamber of the respective pressure generation chambers 12. In addition, a configuration is also applicable in which the communication part 13 in the flow path formation substrate is divided into a plurality of parts for each of the pressure generation chambers 12 and only the manifold part is used as a manifold. Furthermore, another configuration is also applicable in which only the pressure generation chambers 12 are provided in the flow path formation substrate 10 and the ink supply path 14 establishing communication between the manifold 100 and the respective pressure generation chambers 12 is provided on a member (for example, the elastic film 50 or the insulator film which is provided as necessary) which is interposed between the flow path formation substrate 10 and the protection substrate 30.

In a region, which faces the piezoelectric element 300, in the protection substrate 30, a piezoelectric element holding part 32 is provided with a space such that motion of the piezoelectric element 300 is not inhibited. The piezoelectric element holding part 32 may have any configuration as long as the piezoelectric element holding part 32 has a space such that the motion of the piezoelectric element 300 is not inhibited, and the space may or may not be tightly sealed.

It is preferable to use a material with substantially the same rate of thermal expansion as that of the flow path formation substrate 10, such as glass or a ceramic material, for the protection substrate 30, and the protection substrate 30 is formed by using a silicon single crystal substrate which is the same material as that of the flow path formation substrate 10 in the embodiment.

In addition, a through-hole 33 which penetrates through the protection substrate 30 in the thickness direction is provided in the protection substrate 30. In addition, the vicinity of the end portion of the lead electrode 90 which is drawn from each piezoelectric element 300 is provided so as to be exposed in the through-hole 33.

In addition, a drive circuit 120 for driving the aligned piezoelectric elements 300 is fixed to the protection substrate 30. As the drive circuit 120, it is possible to use a circuit substrate or a semiconductor integrated circuit (IC), for example. In addition, the drive circuit 120 and the lead electrode 90 are electrically connected to each other via a connection wiring 121 which is made of a conductive wire such as a bonding wire.

To such a protection substrate 30, a compliance substrate 40 which is configured of a sealing film 41 and a fixation plate 42 is joined. Here, the sealing film 41 is made of a flexible material with low rigidity, and one side surface of the manifold part 31 is sealed with the sealing film 41. In addition, the fixation plate 42 is formed of a relatively hard material. Since a region, which faces the manifold 100, in the fixation plate 42 forms an opening 43 which is completely removed in the thickness direction, the one side surface of the manifold 100 is sealed only with the flexible sealing film 41.

In the ink jet recording head I according to the embodiment, the ink is taken from an ink introduction port which is connected to an external ink supply mechanism which is not shown in the drawing, the inside from the manifold 100 to the nozzle opening 21 is filled with the ink, a voltage is applied between the first electrode 60 and the second electrode 80 corresponding to each of the pressure generation chambers 12 in response to a recording signal from the drive circuit 120, a pressure in each of the pressure generation chambers 12 is raised by causing deflection and deformation of the elastic film 50, the adhesion layer 56, the first electrode 60, and the piezoelectric body layer 70, and ink droplets are ejected from the nozzle opening 21.

Next, a description will be given of an example of a manufacturing method of an ink jet recording head according to the embodiment with reference to FIGS. 4A to 8B. FIGS. 4A to 8B are cross-sectional views of a pressure generation chamber in the longitudinal direction.

Figure 4A:
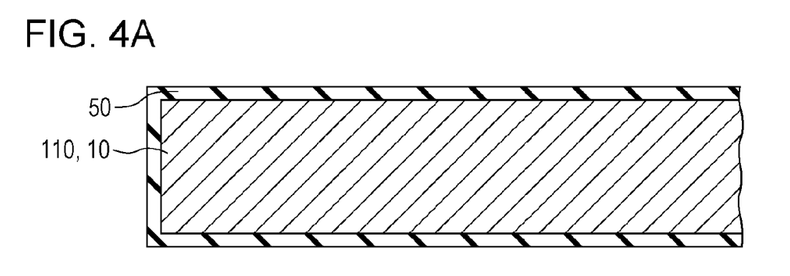
FIGS. 4A and 4B are cross-sectional views showing a manufacturing process of the recording head according to the first embodiment.
Figure 4B:
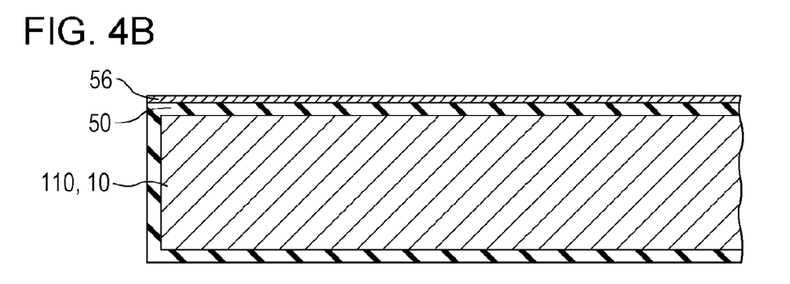

First, a silicon dioxide film which configures the elastic film 50 and is made of silicon dioxide ($SiO_2$) or the like is formed on the surface of a wafer 110 for the flow path formation substrate, which is a silicon wafer, by thermal oxidation as shown in FIG. 4A. Then, the adhesion layer 56 made of titanium oxide or the like is formed on the elastic film 50 (silicon dioxide film) by a sputtering method, thermal oxidation, or the like as shown in FIG. 4B.

Figure 5A:
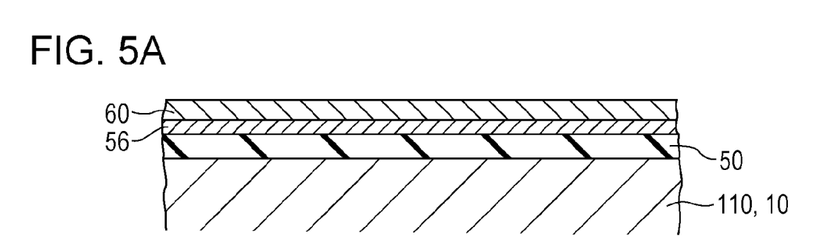
FIGS. 5A to 5C are cross-sectional views showing the manufacturing process of the recording head according to the first embodiment.
Figure 5B:
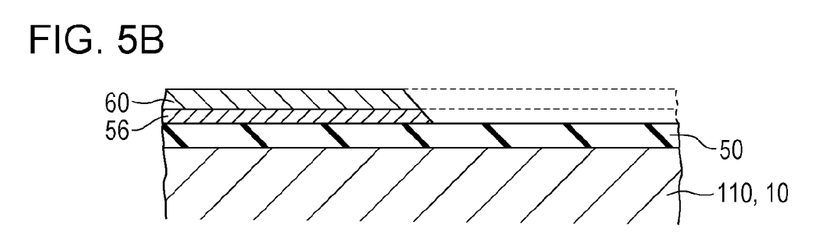

Next, the first electrode 60 made of platinum is formed on the entire surface of the adhesion layer 56 by the sputtering method, the deposition method, or the like as shown in FIG. 5A. Then, as shown in FIG. 5B, a resist (not shown) with a predetermined shape is used as a mask on the first electrode 60, and the adhesion layer 56 and the first electrode 60 are simultaneously patterned such that side surfaces thereof incline.

Then, the piezoelectric body layer 70 which is a thin film is laminated on the first electrode 60 after the resist is peeled off. Although a manufacturing method of the piezoelectric body layer 70 is not particularly limited, the piezoelectric body layer 70 can be produced by a chemical solution method such as a metal-organic decomposition (MOD) method in which the piezoelectric body layer (piezoelectric body film) made of metal oxide is obtained by applying and drying a solution containing metal complex and burning the obtained object at a high temperature, or a sol-gel method. In addition, it is also possible to produce the piezoelectric body layer 70 by a gas phase method, a liquid phase method, or a solid phase method such as a laser abrasion method, a sputtering method, a pulse laser deposition (PLD) method, a CVD method, or an aerosol deposition method.

Figure 5C:
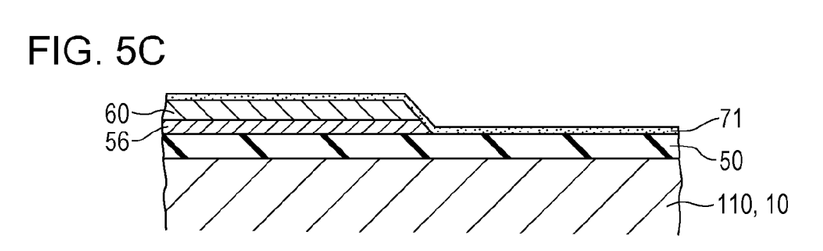

In a specific example of a formation procedure in a case where the piezoelectric body layer 70 is formed by the chemical solution method, the first electrode 60 is first coated with an oxidative product layer formation composition (precursor solution) configured of a MOD solution or a sol which contains a metal complex, specifically a metal complex containing Bi, Ba, Fe, Ti, and Sr by a spin coating method or the like, and a precursor film (composite oxide layer precursor film) 71 of the composite oxide layer 72 is formed as shown in FIG. 5C (application process).

The precursor solution to be applied is a material obtained by mixing the metal complex capable of forming the composite oxide layer 72 containing Bi, Ba, Fe, Ti, and Sr by burning and dissolving or dispersing the mixture in an organic solvent. In a case of forming the composite oxide layer 72 containing Mn, Cr, Co, Ni, Cu, and Zn, a precursor solution containing a metal complex further containing Mn, Cr, Co, Ni, Cu, and Zn is used. A rate of mixture of the metal complex containing Bi, Ba, Fe, Ti, Sr, Mn, Cr, Co, Ni, Cu, and Zn may be set such that the respective metals are included at a desired molar ratio. As the metal complex which contains Bi, Ba, Fe, Ti, Sr, Mn, Cr, Co, Ni, Cu, and Zn, it is possible to use alkoxide, organic acid salt, or β diketone complex, for example. Examples of a metal complex containing Bi include 2-ethylhexanoic acid bismuth and bismuth acetate. Examples of a metal complex containing Ba include barium acetate, barium ethoxide, 2-ethylhexanoic acid barium, and barium acetylacetonato. Examples of a metal complex containing Fe include 2-ethylhexanoic acid iron, iron acetate, tris(acetylacetonato)iron. Examples of a metal complex containing Ti include titanium isopropoxide, 2-ethylhexanoic acid titanium, and titanium (di-isopropoxide)bis(acetylacetonato). Examples of a metal complex containing Sr include strontium acetate, strontium ethoxide, 2-ethylhexanoic acid strontium, and strontium acetylacetonato. Examples of a metal complex containing Mn include 2-ethylhexanoic acid manganese and manganese acetate. Examples of a metal complex containing Cr include 2-ethylhexanoic acid chromium. Examples of a metal complex containing Co include 2-ethylhexanoic acid cobalt and cobalt (III) acetylacetonato. Examples of a metal complex containing Ni include 2-ethylhexanoic acid nickel and nickel acetate. Examples of a metal complex containing Cu include 2-ethylhexanoic acid copper and copper acetate. Examples of a metal complex containing Zn include 2-ethylhexanoic acid zinc and zinc acetate. It is a matter of course that a metal complex containing two or more elements from among Bi, Ba, Fe, Ti, Sr, Mn, Cr, Co, Ni, Cu, and Zn may be used. In addition, examples of the solvent for the precursor solution include propanol, butanol, pentanol, hexanol, octanol, ethylene glycol, propylene glycol, octane, decane, cyclohexane, xylene, toluene, tetrahydrofuran, acetic acid, and octylic acid.

Next, the composite oxide layer precursor film 71 is heated at a predetermined temperature (150° C. to 200° C., for example) and is dried for a predetermined period of time (drying process). Then, the dried composite oxide layer precursor film 71 is heated at a predetermined temperature (350° C. to 450° C., for example) and is maintained for a predetermined period of time to defat the composite oxide layer precursor film 71 (defatting process). The defatting described herein means an operation of removing organic constituents contained in the composite oxide layer precursor film 71 as $NO_2$, $CO_2$, or $H_2O$, for example. Atmospheres for the drying process and the defatting process are not limited, and the drying process and the defatting process may be performed in the ambient air, in an oxygen atmosphere, or in inert gas. In addition, the application process, the drying process, and the defatting process may be performed a plurality of times.

Figure 6A:
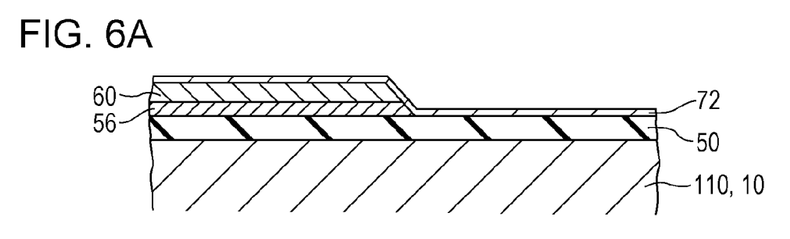
FIGS. 6A and 6B are cross-sectional views showing the manufacturing process of the recording head according to the first embodiment.

Next, the composite oxide layer precursor film 71 is heated at a predetermined temperature, for example, from about 600° C. to about 850° C. and is maintained for a predetermined period of time, for example, for one to ten minutes to burn the composite oxide layer precursor film 71 as shown in FIG. 6A (burning process). By causing crystallization as described above, and the composite oxide layer 72 made of the composite oxide with the perovskite structure, which contains Bi, Ba, Fe, Ti, and Sr, is obtained. An atmosphere of the burning process is also not limited, and the burning process may be performed in the ambient air, in an oxygen atmosphere, or in inert gas. Examples of a heating apparatus which is used in the drying process, the defatting process, and the burning process include a rapid thermal annealing (RTA) apparatus which performs heating by irradiation with an infrared lamp and a hot plate.

Figure 6B:
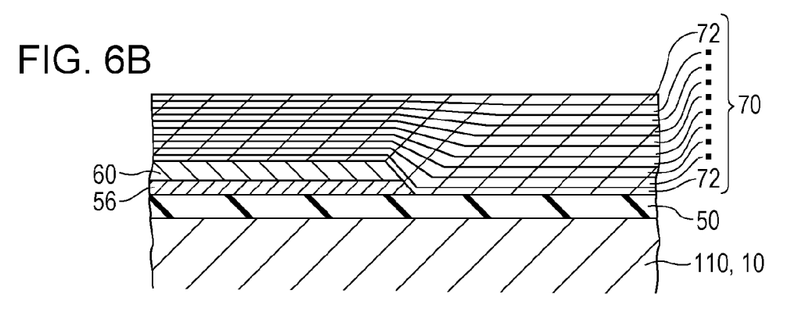

Then, the piezoelectric body layer 70 with a predetermined thickness, which is configured of the composite oxide layer 72 including a plurality of layers, is formed as shown in FIG. 6B by repeating the application process, the drying process, and the defatting process, which were described above, and the application process, the drying process, the defatting process, and the burning process a plurality of times in accordance with a desired film thickness or the like and forming the composite oxide layer 72 including the plurality of layers. In a case where a film thickness obtained by a single application of the solution is about 0.1 µm, for example, the film thickness of the entire piezoelectric body layer 70 configured of the composite oxide layer 72 including ten layers, for example, is about 1.0 µm. Although the composite oxide layer 72 is provided by laminating ten layers in the embodiment, only one layer may be included.

The piezoelectric body layer 70 according to the embodiment which is formed as described above is made of a composite oxide with the perovskite structure which contains Bi, Ba, and Sr in the A site and Fe and Ti in the B site, and the content of Sr with respect to Ba contained in the piezoelectric body layer 70 is equal to or greater than 5 mol % and equal to or less than 18 mol %. By setting the content of Sr with respect to Ba to be within a range of equal to or greater than 5 mol % and equal to or less than 18 mol %, it is possible to enhance the displacement amount of the piezoelectric element. In addition, since strontium is not an alkali metal which is especially sensitive to moisture, it is possible to suppress the aging variation such as moisture absorption of the alkali metal to be relatively small even if strontium occupies a part of the A site in the perovskite structure.

Figure 7A:
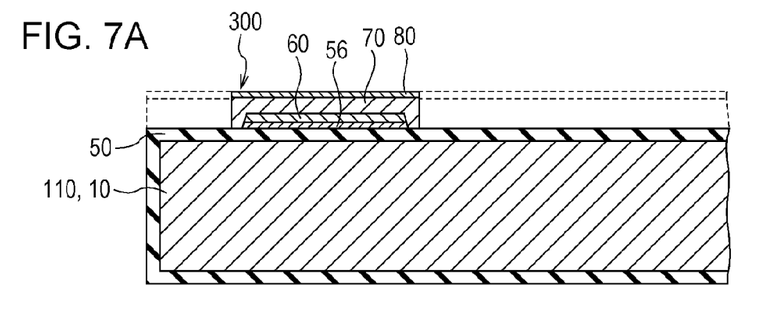
FIGS. 7A to 7C are cross-sectional views showing the manufacturing process of the recording head according to the first embodiment.

After forming the piezoelectric body layer 70, the second electrode 80 made of platinum or the like is formed on the piezoelectric body layer 70 by the sputtering method or the like, the piezoelectric body layer 70 and the second electrode 80 are simultaneously patterned in a region which faces each pressure generation chamber 12, and the piezoelectric element 300 configured of the first electrode 60, the piezoelectric body layer 70, and the second electrode 80 is formed as shown in FIG. 7A. In addition, the piezoelectric body layer 70 and the second electrode 80 can be collectively patterned by performing dry etching via a resist (not shown) which is formed into a predetermined shape. Thereafter, annealing may be performed in a temperature range from 600° C. to 850° C., for example, as necessary. With such an operation, it is possible to form satisfactory boundary faces between the piezoelectric body layer 70 and the first electrode 60 and between the piezoelectric body layer 70 and the second electrode 80 and to enhance a crystal property of the piezoelectric body layer 70.

Figure 7B:
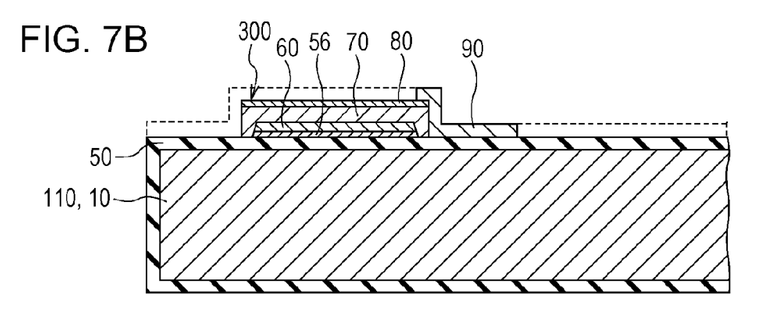

Next, the lead electrode 90 made of gold (Au) or the like is formed over the entire surface of the wafer 110 for the flow path formation substrate, and the patterning is then performed for each piezoelectric element 300 via a mask pattern (not shown) configured of a resist, for example, as shown in FIG. 7B.

Figure 7C:
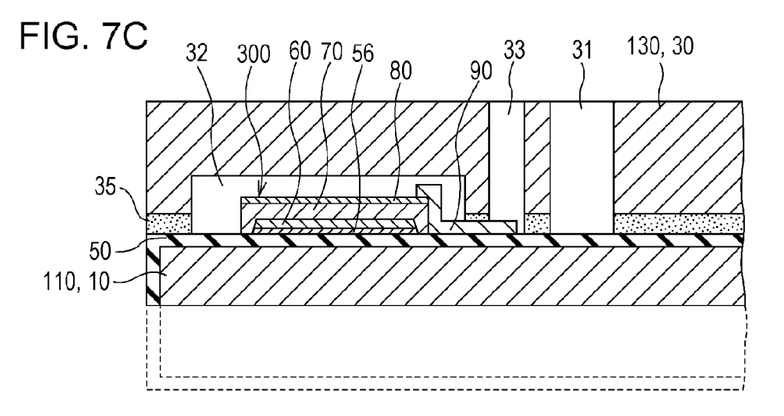

Then, a wafer 130 for a protection substrate which is a silicon wafer and is to be used as a plurality of protection substrates 30 is joined to the wafer 110 for the flow path formation substrate on the side of the piezoelectric element 300 via the adhesive agent 35, and the wafer 110 for the flow path formation substrate is then thinned to a predetermined thickness as shown in FIG. 7C.

Figure 8A:
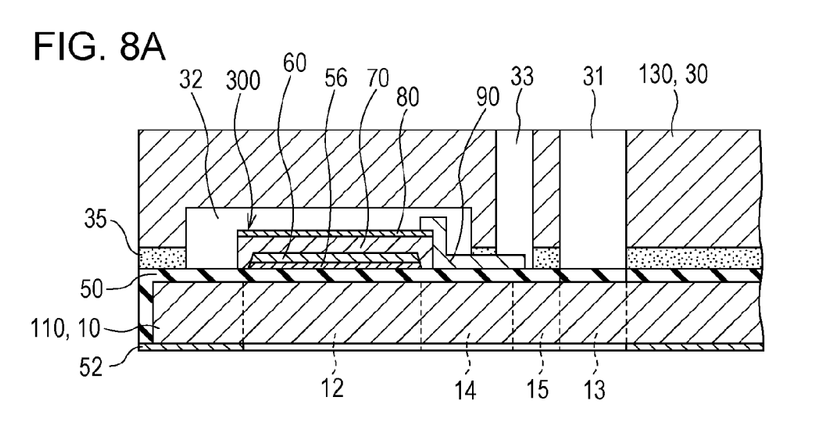
FIGS. 8A and 8B are cross-sectional views showing the manufacturing process of the recording head according to the first embodiment.

Next, a mask film 52 is newly formed on the wafer 110 for the flow path formation substrate and is patterned into a predetermined shape as shown in FIG. 8A.

Figure 8B:
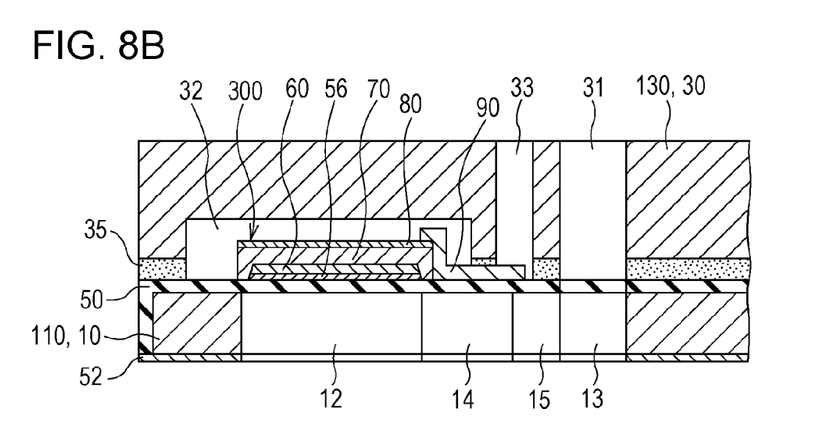

Then, the pressure generation chamber 12, the communication part 13, the ink supply path 14, the communication path 15, and the like corresponding to the piezoelectric element 300 are formed by performing anisotropic etching (wet etching) on the wafer 110 for the flow path formation substrate via the mask film 52 by using an alkali solution such as KOH as shown in FIG. 8B.

Thereafter, unnecessary parts at outer edges of the wafer 110 for the flow path formation substrate and the wafer 130 for the protection substrate are cut and removed by dicing, for example. Then, the ink jet recording head I according to the embodiment is obtained by removing the mask film 52 from a surface, which is opposite to the side of the wafer 130 for the protection substrate, of the wafer 110 for the flow path formation substrate, then joining the nozzle plate 20 with the nozzle openings 21 bored therein, joining the compliance substrate 40 to the wafer 130 for the protection substrate, and dividing the wafer 110 for the flow path formation substrate and the like into flow path formation substrates 10 and the like, each of which has a single chip size as shown in FIG. 1.

EXAMPLES

Hereinafter, examples will be shown, and further specific descriptions of the invention will be given. In addition, the invention is not limited to the following examples.

Example 1

First, a silicon dioxide film with a film thickness of 1170 nm was formed on a surface of a single crystal silicon (Si) substrate which is oriented in a (110) face by thermal oxidation. Then, a titanium oxide film (adhesion layer 56) was formed by forming a titanium film with a film thickness of 40 nm on the silicon dioxide film by an RF magnetron sputtering method and causing thermal oxidation. Then, a platinum film (first electrode 60) with a film thickness of 100 nm was formed on the titanium oxide film by the RF magnetron sputtering method.

Then, the piezoelectric body layer 70 was formed on the first electrode 60 by the spin coating method. The method was as follows. First, a precursor solution was prepared by mixing n-octane solutions of 2-ethylhexanoic acid bismuth, 2-ethylhexanoic acid iron, 2-ethylhexanoic acid manganese, 2-ethylhexanoic acid barium, 2-ethylhexanoic acid strontium, and 2-ethylhexanoic acid titanium such that Bi, Fe, Mn, Ba, Sr, and Ti were contained at a molar ratio of Bi:Fe:Mn:Ba:Sr:Ti=75.0:71.25:3.75:23.75:1.25:25.0.

Then, the prepared precursor solution was dripped onto the substrate on which the first electrode 60 was formed, the substrate was rotated at 500 rpm for five seconds and was then rotated at 3000 rpm for twenty seconds, and the composite oxide layer precursor film 71 was formed by the spin coating method (application process). Then, the substrate was placed on a hot plate and was dried at 180° C. for two minutes (drying process). Then, the substrate was placed on the hot plate and was defatted at 350° C. for two minutes (defatting process). The processing from the solution application to the defatting process was repeated twice, and the substrate was burned at 750° C. for five minutes in an oxygen atmosphere by a rapid thermal annealing (RTA) apparatus (burning process). Then, the above processes were repeated six times, and the piezoelectric body layer 70 configured of the composite oxide layer 72 including twelve layers was formed by the application performed a total of twelve times.

Thereafter, an iridium film (second electrode 80) with a film thickness of 50 nm was formed on the piezoelectric body layer 70 by the RF magnetron sputtering method. Through such operations, the piezoelectric element 300 provided with the piezoelectric body layer 70, in which the content of Sr with respect to Ba was 5.26 mol %, was obtained.

Example 2

The same operations as those in Example 1 were performed except that a solution prepared by mixing n-octane solutions of 2-ethylhexanoic acid bismuth, 2-ethylhexanoic acid iron, 2-ethylhexanoic acid manganese, 2-ethylhexanoic acid barium, 2-ethylhexanoic acid strontium, and 2-ethylhexanoic acid titanium such that the Bi, Fe, Mn, Ba, Sr, and Ti were contained at a molar ratio of Bi:Fe:Mn:Ba:Sr:Ti=75.0:71.25:3.75:23.0:2.0:25.0 was used as the precursor solution. Through such operations, the piezoelectric element 300 provided with the piezoelectric body layer 70, in which the content of Sr with respect to Ba was 8.70 mol %, was obtained.

Example 3

The same operations as those in Example 1 were performed except that a solution prepared by mixing n-octane solutions of 2-ethylhexanoic acid bismuth, 2-ethylhexanoic acid iron, 2-ethylhexanoic acid manganese, 2-ethylhexanoic acid barium, 2-ethylhexanoic acid strontium, and 2-ethylhexanoic acid titanium such that Bi, Fe, Mn, Ba, Sr, and Ti were contained at a molar ratio of Bi:Fe:Mn:Ba:Sr:Ti=75.0:71.25:3.75:22.5:2.5:25.0 was used as the precursor solution. Through such operations, the piezoelectric element 300 provided with the piezoelectric body layer 70, in which the content of Sr with respect to Ba was 11.11 mol %, was obtained.

Example 4

The same operations as those in Example 1 were performed except that a solution prepared by mixing n-octane solutions of 2-ethylhexanoic acid bismuth, 2-ethylhexanoic acid iron, 2-ethylhexanoic acid manganese, 2-ethylhexanoic acid barium, 2-ethylhexanoic acid strontium, and 2-ethylhexanoic acid titanium such that Bi, Fe, Mn, Ba, Sr, and Ti were contained at a molar ratio of Bi:Fe:Mn:Ba:Sr:Ti=75.0:71.25:3.75:22.0:3.0:25.0 was used as the precursor solution. Through such operations, the piezoelectric element 300 provided with the piezoelectric body layer 70, in which the content of Sr with respect to Ba was 13.63 mol %, was obtained.

Example 5

The same operations as those in Example 1 were performed except that a solution prepared by mixing n-octane solutions of 2-ethylhexanoic acid bismuth, 2-ethylhexanoic acid iron, 2-ethylhexanoic acid manganese, 2-ethylhexanoic acid barium, 2-ethylhexanoic acid strontium, and 2-ethylhexanoic acid titanium such that Bi, Fe, Mn, Ba, Sr, and Ti were contained at a molar ratio of Bi:Fe:Mn:Ba:Sr:Ti=75.0:71.25:3.75:21.25:3.75:25.0 was used as the precursor solution. Through such operations, the piezoelectric element 300 provided with the piezoelectric body layer 70, in which the content of Sr with respect to Ba was 17.65 mol %, was obtained.

Comparative Example 1

The same operations as those in Example 1 were performed except that a solution prepared by mixing n-octane solutions of 2-ethylhexanoic acid bismuth, 2-ethylhexanoic acid iron, 2-ethylhexanoic acid manganese, 2-ethylhexanoic acid barium, and 2-ethylhexanoic acid titanium such that Bi, Fe, Mn, Ba, and Ti were contained at a molar ratio of Bi:Fe:Mn:Ba:Ti=75.0:71.25:3.75:25.0:25.0 was used as the precursor solution. Through such operations, the piezoelectric element 300 provided with the piezoelectric body layer 70 which did not contain Sr was obtained.

Comparative Example 2

The same operations as those in Example 1 were performed except that a solution prepared by mixing n-octane solutions of 2-ethylhexanoic acid bismuth, 2-ethylhexanoic acid iron, 2-ethylhexanoic acid manganese, 2-2-ethylhexanoic acid strontium, and 2-ethylhexanoic acid titanium such that Bi, Fe, Mn, Sr, and Ti were contained at a molar ratio of Bi:Fe:Mn:Sr:Ti=75.0:71.25:3.75:25.0:25.0 was used as the precursor solution. Through such operations, the piezoelectric element 300 provided with the piezoelectric body layer 70 which did not contain Ba was obtained.

Test Example 1

Figure 9A:
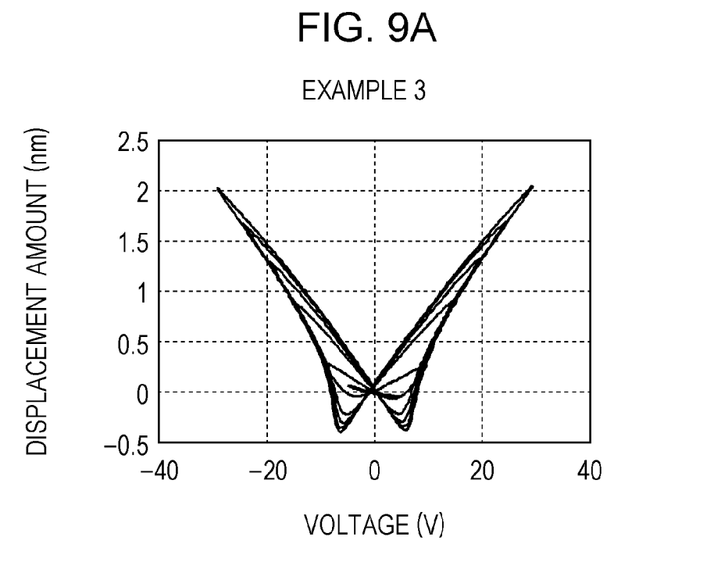
FIGS. 9A and 9B are diagrams showing relationships between electric field-induced strain and a voltage in Example 3 and Comparative Example 1.
Figure 9B:
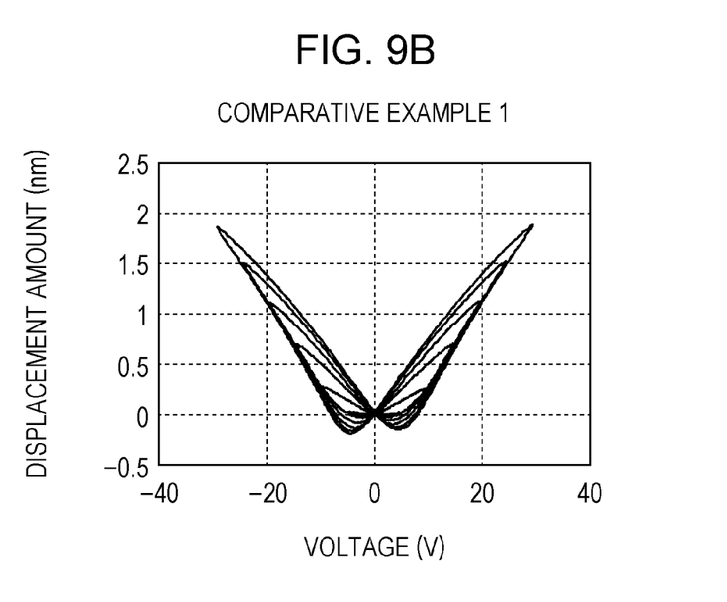
Figure 10:
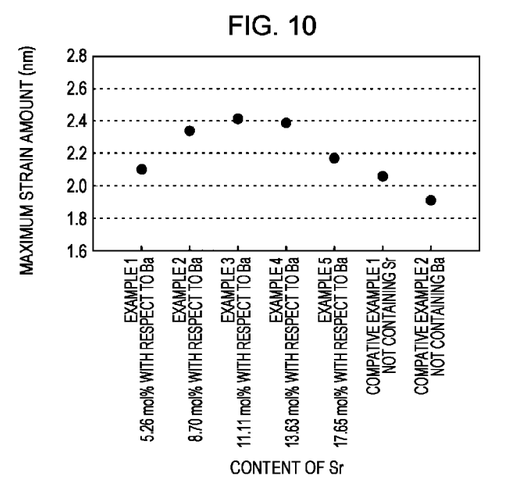
FIG. 10 is a diagram showing relationships between maximum strain amounts and Sr content in Examples 1 to 5 and Comparative Examples 1 and 2.

For the piezoelectric elements in Examples 1 to 5 and Comparative Examples 1 and 2, a displacement measurement apparatus (DBLI) manufactured by aixACCT Systems was used to obtain relationships of electric field-induced strain (displacement amount) with respect to voltage (butterfly curves) at a room temperature by using an electrode pattern of φ=500 μm and applying a voltage at a frequency of 1 kHz. From these butterfly curves, maximum strain amounts of the piezoelectric body layer from arrival strain to reverse arrival strain were respectively obtained. Table collectively shows the measurement results of the maximum strain amounts in Examples 1 to 5 and Comparative Examples 1 and 2. FIGS. 9A and 9B show butterfly curves in Example 3 and Comparative Example 1, and FIG. 10 shows relationships between the maximum strain amounts and the Sr content in Examples 1 to 5 and Comparative Examples 1 and 2. In addition, FIG. 11 shows relationships between the maximum strain amount and the Sr content in Examples 1 to 5 and Comparative Example 1 in more detail.

As shown in FIGS. 9A and 9B, it was possible to understand that the displacement amount of the piezoelectric element in Example 3 was great on the minus side in a low-voltage region of a voltage from −10 V to +10 V where polarization shifted, in comparison with the butterfly curves of Example 3 and Comparative Example 1. Based on this fact, it was confirmed that the maximum strain amount from the arrival strain to the reverse arrival strain in Example 3 exhibited a significantly large displacement amount (2.413 nm) as compared with the maximum strain amount in Comparative Example 1.

Figure 11:
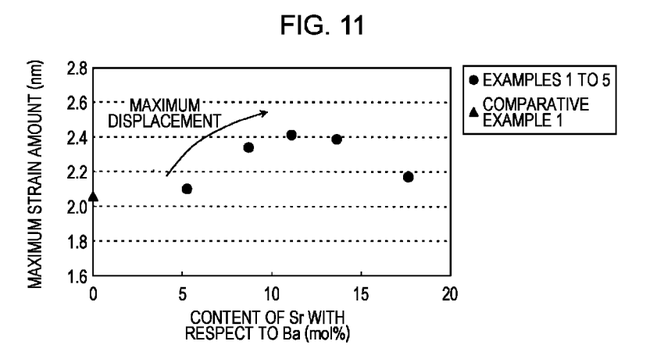
FIG. 11 is a diagram showing relationships between maximum strain amounts and Sr content in Examples 1 to 5 and Comparative Example 1.

As shown in FIGS. 10 and 11 and Table, the maximum strain amounts of the piezoelectric elements in Examples 1 to 5 ranged from 2.101 nm to 2.413 nm, and it was confirmed that all the maximum strain amounts thereof were larger than that of the piezoelectric element in Comparative Example 1, which did not contain Sr, and that of the piezoelectric element in Comparative Example 2, which did not contain Ba. Based on that fact, it was possible to understand that the displacement amount can be enhanced by configuring the piezoelectric body layer with Bi, Fe, Mn, Ba, Ti, and Sr (Examples 1 to 5). Among the examples, the maximum strain amounts of the piezoelectric elements in Examples 2 to 4, in which the content of Sr with respect to Ba contained in the piezoelectric body layers was 8.70 mol %, 11.11 mol %, and 13.63 mol %, respectively, were significantly large.

TABLE

| | Content of Sr with respect to Ba | Maximum strain amount (nm) |
|---|---|---|
| Example 1 | 5.26 mol % | 2.101 |
| Example 2 | 8.70 mol % | 2.340 |
| Example 3 | 11.11 mol % | 2.413 |
| Example 4 | 13.63 mol % | 2.389 |
| Example 5 | 17.65 mol % | 2.171 |
| Comparative Example 1 | Sr not contained | 2.059 |
| Comparative Example 2 | Ba not contained | 1.910 |

Other Embodiments

Although embodiments of the liquid ejecting head according to the invention were described above, the basic configuration of the invention is not limited to the aforementioned configuration. Although the silicon single crystal substrate was exemplified as the flow path formation substrate 10 in the above embodiments, the invention is not particularly limited thereto, and an SOI substrate or a material such as glass may be used, for example.

Furthermore, although the piezoelectric element 300 in which the first electrode 60, the piezoelectric body layer 70, and the second electrode 80 were sequentially laminated on the substrate (flow path formation substrate 10) was exemplified in the above embodiments, the invention is not particularly limited thereto. For example, it is also possible to apply the invention to a longitudinal vibration-type piezoelectric element in which piezoelectric materials and electrode formation materials are alternately laminated so as to expand and contract in an axial direction, for example.

Although the ink jet recording head was exemplified as the liquid ejecting head in the aforementioned embodiments, the invention is intended to widely target general liquid ejecting heads, and it is a matter of course that the invention can be applied to liquid ejecting heads which eject liquid other than ink. Examples of other liquid ejecting heads include various recording heads used in image recording apparatuses such as a printer, colorant ejecting heads used in manufacturing color filters for a liquid crystal display and the like, electrode material ejecting heads used in forming electrodes for an organic EL display, field emission display (FED), and the like, and bioorganic substance ejecting heads used in manufacturing a bio chip.

Liquid Ejecting Apparatus

Figure 12:
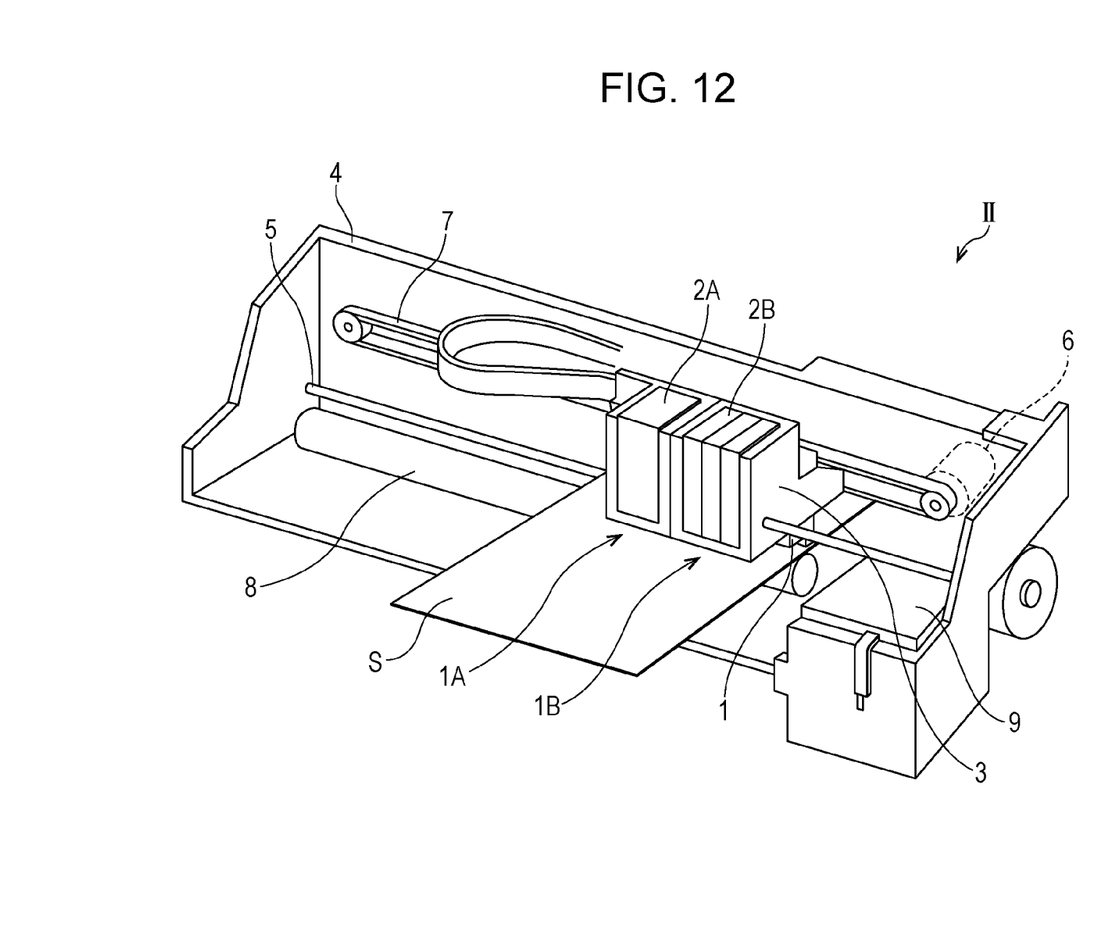
FIG. 12 is a diagram showing an outline configuration of a recording apparatus according to an embodiment of the invention.

In addition, the ink jet recording head according to the aforementioned embodiments configures a part of a recording head unit which is provided with an ink flow path communicating with an ink cartridge or the like and is mounted on a liquid ejecting apparatus such as an ink jet recording apparatus. FIG. 12 is an outline diagram showing an example of the ink jet recording apparatus.

In an ink jet recording apparatus II shown in FIG. 12, cartridges 2A and 2B which configure ink supply mechanisms are detachably provided in recording head units 1A and 1B, each of which is provided with the ink jet recording head I, and a carriage 3 on which the recording head units 1A and 1B are mounted is provided on a carriage shaft 5 attached to an apparatus main body 4 so as to be movable in an axial direction. It is assumed that the recording head units 1A and 1B eject a black ink composition and a color ink composition, respectively.

In addition, the carriage 3 on which the recording head units 1A and 1B are mounted is moved along the carriage shaft 5 by transmitting drive force from the drive motor 6 to the carriage 3 via a plurality of gears and a timing belt 7. In contrast, a transport roller 8 as a transport mechanism is provided in the apparatus main body 4, and a recording sheet S as a recording medium such as a paper is transported by the transport roller 8. In addition, the transport mechanism for transporting the recording sheet S is not limited to the transport roller, and a belt, a drum, or the like may be used instead.

Ultrasonic Sensor and Piezoelectric Motor

Since the piezoelectric element according to the invention has an excellent displacement property, it is possible to preferably use the piezoelectric element by mounting the piezoelectric element on a liquid ejecting apparatus, an ultrasonic sensor, a piezoelectric motor, an ultrasonic motor, a piezoelectric transformer, a vibration-type dust removing apparatus, pressure-electricity converter, an ultrasonic wave generator, a pressure sensor, an acceleration sensor, and the like as well as the liquid ejecting head, representative examples of which include the ink jet recording head.

Power Generating Apparatus

Since the piezoelectric element according to the invention has a satisfactory energy-to-electricity conversion performance, it is possible to preferably use the piezoelectric element by mounting the piezoelectric element on a power generating apparatus. Examples of the power generating apparatus include a power generating apparatus using a pressure-electricity conversion effect, a power generating apparatus using electron excitation by light (photovoltaic force), a power generating apparatus using electron excitation by heat (thermo electromotive force), and a power generating apparatus using vibration.

The piezoelectric element according to the invention can be preferably used in a pyroelectric device such as an infrared detector, a terahertz detector, a temperature sensor, or a heat sensitive sensor or a ferroelectric element such as a ferroelectric memory.

The entire disclosure of Japanese Patent Application No. 2013-238246, filed Nov. 18, 2013 is expressly incorporated by reference herein.

What is claimed is:

1. A piezoelectric element comprising:
a first electrode;
a piezoelectric body layer provided on the first electrode, the piezoelectric body layer made of a composite oxide with a perovskite structure having a general formula of $ABO_3$, wherein the complex oxide contains bismuth, barium, iron, titanium, and strontium, the content of strontium with respect to barium is equal to or greater than 8.70 mol % and equal to or less than 13.63 mol %, and the strontium is located at the A site of the $ABO_3$ formula; and
a second electrode provided on the piezoelectric body layer.

2. A liquid ejecting head comprising:
the piezoelectric element according to claim 1.

3. A liquid ejecting apparatus comprising:
the liquid ejecting head according to claim 2;
a transport part transporting a recording medium; and
liquid to be ejected from the liquid ejecting head.

4. An ultrasonic sensor comprising:
the piezoelectric element according to claim 1;
a vibrating part transmitting displacement caused by driving the piezoelectric element to the outside; and
a matching layer transmitting a generated pressure wave to the outside.

5. A piezoelectric motor comprising at least:
a vibrating body having the piezoelectric element according to claim 1; and
a moving body which is brought into contact with the vibrating body.

6. A power generating apparatus comprising:
the piezoelectric element according to claim 1; and
an extraction electrode extracting electric charge caused by the piezoelectric element from at least one of the first electrode and the second electrode.

\* \* \* \* \*